US011316105B2

(12) United States Patent
Shen et al.

(10) Patent No.: US 11,316,105 B2
(45) Date of Patent: Apr. 26, 2022

(54) PHASE CHANGE MATERIAL SWITCH AND METHOD OF FABRICATING SAME

(71) Applicant: International Business Machines Corporation, Armonk, NY (US)

(72) Inventors: Tian Shen, Clifton Park, NY (US); Ruilong Xie, Niskayuna, NY (US); Kevin W. Brew, Albany, NY (US); Heng Wu, Guilderland, NY (US); Jingyun Zhang, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 134 days.

(21) Appl. No.: 16/821,660

(22) Filed: Mar. 17, 2020

(65) Prior Publication Data
US 2021/0296580 A1 Sep. 23, 2021

(51) Int. Cl.
*H01L 45/00* (2006.01)

(52) U.S. Cl.
CPC .......... *H01L 45/1206* (2013.01); *H01L 45/06* (2013.01); *H01L 45/126* (2013.01); *H01L 45/143* (2013.01); *H01L 45/144* (2013.01); *H01L 45/1675* (2013.01)

(58) Field of Classification Search
CPC ... H01L 45/1206; H01L 45/06; H01L 45/126; H01L 45/143; H01L 45/144; H01L 45/1675; H01L 45/1226; H01L 45/145
See application file for complete search history.

(56) References Cited

U.S. PATENT DOCUMENTS

| 7,494,849 | B2 | 2/2009 | Oliva et al. |
| 7,579,616 | B2 | 8/2009 | Chen et al. |
| 8,174,877 | B2 * | 5/2012 | Baks ................... H01L 45/1286 365/163 |
| 9,257,647 | B2 | 2/2016 | Borodulin et al. |
| 9,419,213 | B2 | 8/2016 | Raieszadeh et al. |
| 9,472,281 | B1 * | 10/2016 | Franca-Neto ...... G11C 13/0002 |
| 9,647,209 | B2 | 5/2017 | Goktepeli et al. |
| 9,698,803 | B1 | 7/2017 | Dropps |
| 10,164,608 | B2 | 12/2018 | Belot et al. |
| 10,566,528 | B1 * | 2/2020 | El-Hinnawy ........... H01L 45/06 |
| 11,004,511 | B2 * | 5/2021 | Cohen ................. H01L 45/1675 |
| 2008/0013373 | A1 * | 1/2008 | Park ..................... G11C 11/5678 365/185.03 |
| 2010/0019220 | A1 | 1/2010 | Suh |

(Continued)

FOREIGN PATENT DOCUMENTS

CN 109888096 A 6/2019
WO PCT/IB2021/051434 5/2021

OTHER PUBLICATIONS

Daniele Lelmini et al., "Analytical model for subthreshold conduction and threshold switching in chalcogenide-based memory devices", Journal of Applied Physics, 2007, vol. 102, pp. 054517-1-054517-13.

(Continued)

*Primary Examiner* — Allison Bernstein
(74) *Attorney, Agent, or Firm* — Randall Bluestone; Ryan, Mason & Lewis, LLP

(57) ABSTRACT

A phase change material switch includes a phase change layer disposed on a metal liner. A gate dielectric layer is disposed on the phase change layer. A metal gate liner is disposed on the gate dielectric layer.

25 Claims, 12 Drawing Sheets

(56) References Cited

U.S. PATENT DOCUMENTS

2017/0365427 A1 12/2017 Borodulin et al.
2021/0057489 A1 2/2021 Liao et al.

OTHER PUBLICATIONS

N. El-Hinnawy et al., "A Four-Terminal, Inline, Chalcogenide Phase-Change RF Switch Using an Independent Resistive Heater for Thermal Actuation," IEEE Electron Device Letters, Oct. 2013, pp. 1313-1315, vol. 34, No. 10.
S. Kim et al., "Resistance and Threshold Switching Voltage Drift Behavior in Phase-Change Memory and Their Temperature Dependence at Microsecond Time Scales Studied Using a Micro-Thermal Stage," IEEE Transactions on Electron Devices, Mar. 2011, pp. 584-592, vol. 58, No. 3.
K.N. Chen et al., "Programmable Via Using Indirectly Heated Phase-Change Switch for Reconfigurable Logic Applications," IEEE Electron Device Letters, Jan. 2008, pp. 131-133, vol. 29, No. 1.
B. Rajendran et al., "On the Dynamic Resistance and Reliability of Phase Change Memory," Symposium on VLSI Technology Digest of Technical Papers, Jun. 17-19, 2008, pp. 96-97.

* cited by examiner

PHASE CHANGE MATERIAL SWITCH AND METHOD OF FABRICATING SAME

BACKGROUND

Currently, an emerging memory device technology is that of phase change memory. Phase change memory (PCM) is a type of nonvolatile random-access memory (RAM). PCM exploits the behavior of a phase change material in which the phase change material is capable of transitioning between a crystalline phase and an amorphous phase responsive to an electrical current passing through the phase change material. Typically, in PCM fabrication the phase change material includes a chalcogenide compound such as germanium-antimony-tellurium (GST).

The PCM includes a region of phase change material disposed between a bottom electrode contact and a top electrode contact. The phase change material has a low resistivity when in the crystalline phase and a high resistivity when in the amorphous phase. To set the PCM in the amorphous phase, the phase change material is first melted and then quenched rapidly by applying a large electrical current pulse for short period of time leaving a region of amorphous, highly resistive material in the PCM cell. To set the PCM in the crystalline phase, a medium electrical current pulse is applied to anneal the phase change material at a temperature between the crystallization temperature and the melting temperature for a time period long enough to crystallize the phase change material having a relatively low resistivity. To read the state of the PCM, the resistivity of the cell is measured by passing a low current electrical signal through the cell which does not disturb the state of the phase change material. In addition, PCM technology has the ability to achieve a number of distinct intermediary states, thereby providing for the capability for PCM to hold multiple bits in a single cell providing for increased memory density.

SUMMARY

Illustrative embodiments of the present application include techniques for use in semiconductor manufacture. In one illustrative embodiment, a phase change material switch comprises a phase change layer disposed on a metal liner. The phase change material switch further comprises a gate dielectric layer disposed on the phase change layer. The phase change material switch further comprises a metal gate liner disposed on the gate dielectric layer.

In another illustrative embodiment, a phase change material bridge device comprises an electrode comprising an intra-metal dielectric layer and at least two metal contact vias in the intra-metal dielectric layer. The phase change material bridge device further comprises a metal liner disposed on a portion of the intra-metal dielectric layer and the least two metal contact vias. The phase change material bridge device further comprises a phase change layer disposed on the metal liner. The phase change material bridge device further comprises a gate dielectric layer disposed on the metal liner and the phase change layer and the remaining portion of the intra-metal dielectric layer and the least two metal contact vias. The metal liner and the phase change layer comprise a horizontal bridge between the at least two metal contact vias. The phase change material bridge device further comprises a metal gate liner disposed on the gate dielectric layer.

In another illustrative embodiment, a semiconductor structure comprises a semiconductor substrate. The semiconductor structure further comprises an electrode disposed on the semiconductor substrate. The electrode comprises an intra-metal dielectric layer and at least two metal contact vias in the intra-metal dielectric layer. The semiconductor structure further comprises a metal liner disposed on a portion of the intra-metal dielectric layer and the least two metal contact vias. The semiconductor structure further comprises a phase change layer disposed on the metal liner. The metal liner and the phase change layer comprise a horizontal bridge between the at least two metal contact vias. The semiconductor structure further comprises a gate dielectric layer disposed on the phase change layer. The semiconductor structure further comprises a metal gate liner disposed on the gate dielectric layer.

In another illustrative embodiment, a method comprises forming a metal liner on an electrode having an intra-metal dielectric layer and at least two metal contact vias. The method further comprises forming a phase change layer on the metal liner. The method further comprises forming a first hardmask on the phase change layer. The method further comprises selectively removing a portion of the metal liner, the phase change layer and the first hardmask to expose a portion of the intra-metal dielectric layer and each of the at least two metal contact vias. A remaining portion of the metal liner, the phase change layer and the first hardmask forms a horizontal bridge between the at least two metal contact vias. The method further comprises forming a gate dielectric layer on exterior surfaces of the metal liner, the phase change layer and the first hardmask, and the exposed portions of the intra-metal dielectric layer and each of the at least two metal contact vias. The method further comprises forming a metal gate liner on the gate dielectric layer.

In another illustrative embodiment, a method comprises forming an electrode comprising an intra-metal dielectric layer and at least two metal contact vias in the intra-metal dielectric layer. The method further comprises forming a metal liner on the electrode. The method further comprises forming a sacrificial layer on the metal liner. The method further comprises forming a first hardmask on the sacrificial layer. The method further comprises selectively removing a portion of the metal liner, the sacrificial layer and the first hardmask to expose a portion of the intra-metal dielectric layer and each of the at least two metal contact vias. A remaining portion of the metal liner, the sacrificial layer and the first hardmask forms a bridge between the at least two metal contact vias. The method further comprises removing the first hardmask. The method further comprises forming a gate dielectric layer on the metal liner and the exposed portions of the intra-metal dielectric layer and each of the at least two metal contact vias. The method further comprises forming a metal gate liner on the gate dielectric layer. The method further comprises forming a second hardmask on the metal gate liner. The method further comprises etching the second hardmask to expose a portion of the metal gate liner. The method further comprises removing the exposed portion of the metal gate liner to expose the gate dielectric layer. The method further comprises removing the exposed portion of the gate dielectric layer to expose the sacrificial layer and a portion of the intra-metal dielectric layer and each of the at least two metal contact vias. The method further comprises removing the sacrificial layer to expose the metal liner and forming an airgap defined between a top surface of the metal liner and a bottom surface of the gate dielectric layer. The method further comprises depositing a phase change layer in the airgap and on the exposed portion of the metal liner, the intra-metal dielectric layer and each of the at least two metal contact vias.

Other embodiments will be described in the following detailed description of embodiments, which is to be read in conjunction with the accompanying figures.

DETAILED DESCRIPTION

Figure 1:
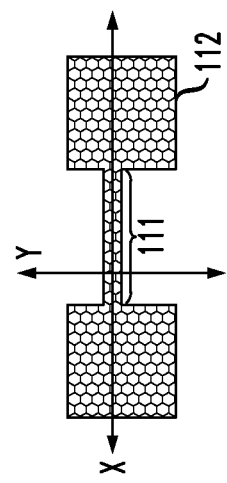
FIG. 1 depicts a plan view of a structure indicating an X cross-section location and a Y cross-section location for each of the following figures.

This disclosure relates generally to phase change material switches, and more particularly to non-volatile four-terminal phase change material switches.

Exemplary embodiments of the invention will now be discussed in further detail with regard to phase change material switches. A phase change material has been used for non-volatile memory devices, through the resistance difference between different phase state from joule heating. When amorphized, the phase change material shows high resistance (open circuit), and when recrystallized, the phase change material shows low resistance (closed circuit). Thus, the threshold voltage is a function of amorphized volume. Current structures use only two terminals, which are used both for programming and reading, thereby making it less useful as an electrical switching device.

Accordingly, illustrative embodiments provide a single 4-terminal switching device using at least a phase change material and a wrap-around gate dielectric layer and metal gate liner (also referred to as a heater), where the gate dielectric layer is between the phase change material and the metal gate liner. The metal gate liner and the gate dielectric layer are configured to be orthogonal to the phase change layer thereby forming the 4-terminal switching device. By forming such a device, the control circuit and signal circuit can be completely separated, thus allowing for broader applications.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming such devices are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

Illustrative embodiments for fabricating a phase change material switching device will be described below with reference to FIGS. 1-13. Note that the same reference numeral (100) is used to denote the structure through the various intermediate fabrication stages illustrated in FIGS. 1 through 5, and reference numeral (200) is used to denote the structure through the various intermediate fabrication stages illustrated in FIGS. 6-13. Note also that the phase change material switching device described herein can also be considered to be a semiconductor device and/or an integrated circuit, or some part thereof. For the purpose of clarity, some fabrication steps leading up to the production of the phase change material switching device as illustrated in FIGS. 1-13 are omitted. In other words, one or more well-known processing steps which are not illustrated but are well-known to those of ordinary skill in the art have not been included in the figures.

Figure 2:
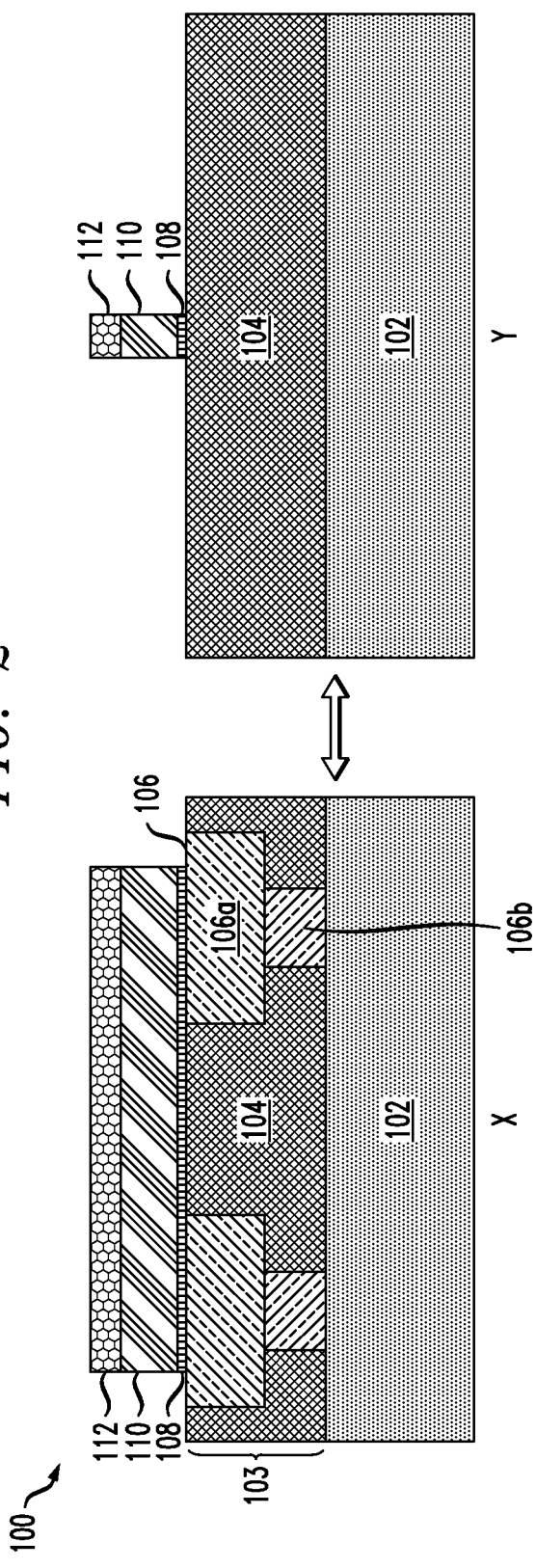
FIG. 2 is a cross sectional view of the structure of FIG. 1 at a first-intermediate fabrication stage, according to an illustrative embodiment.

FIGS. 1-5 illustrate one embodiment of the present invention. FIG. 1 illustrates a partial structure 100 (in plan view) showing hardmask 112 and indicating an X-cross section location and a Y cross-section location for identification purposes. FIG. 2 illustrates structure 100 of FIG. 1 at a first-intermediate fabrication stage. Structure 100 first includes substrate 102. In general, substrate 102 may comprise one or more different types of semiconductor substrate structures and materials and any prior processed layers. For example, in one embodiment, substrate 102 can be a bulk semiconductor substrate (e.g., wafer) that is formed of silicon (Si) or germanium (Ge), or other types of substrate materials that are commonly used in bulk semiconductor fabrication processes such as a silicon-germanium alloy, compound semiconductor materials (e.g. III-V), active semiconductor layer of an SOI (silicon-on-insulator) substrate, GeOI (germanium-on-insulator) substrate, or other type of semiconductor-on-insulator substrate, which comprises an insulating layer (e.g., oxide layer) disposed between a base substrate layer (e.g., silicon substrate) and the active semiconductor layer (e.g., Si, Ge, etc.) in which active circuit components are formed as part of an FEOL, and some BEOL layers prior to the forming of the switch device.

Structure 100 further includes memory electrode 103 formed on substrate 102. Memory electrode 103 includes interconnects 106 in dielectric layer 104. The dielectric layer 104, for example, serves as an interconnect dielectric (ICD) layer in which interconnects are formed. A lower etch stop layer (not shown) may be provided beneath the ICD layer. The lower etch stop layer can comprise various types of materials. In one embodiment, the lower etch stop layer comprises a dielectric material. The lower etch stop layer, in one embodiment, can comprise nitrogen doped BLOK (NBLOK) or low k NBLOK. Other types of etch stop materials such as silicon nitride can also be useful.

In one embodiment, the ICD includes lower and upper portions. The lower portion serves as an interlevel dielectric (ILD) layer while the upper portion serves as an intrametal dielectric (IMD) layer. The dielectric layer can be a single layer or multi-layered stack. For example, a single layer can be used to serve as both the ILD and 1 MB or separate layers are used for the ILD and IMD. In some cases, an etch stop layer can be formed between the ILD and IMD.

The dielectric layer can comprise, for example, silicon oxide. Other types of dielectric materials are also useful. For example, the dielectric layer can comprise silicon nitride, silicon dioxide, silicon oxynitride, SiCN, SiOCN, SiOC, SiBCN, a dielectric metal oxide, a dielectric metal nitride, doped silicon oxide such as fluorinated silicon oxide (FSG), undoped or doped silicate glasses such as boron phosphate silicate glass (BPSG) and phosphate silicate glass (PSG), undoped or doped thermally grown silicon oxide, undoped or doped TEOS deposited silicon oxide, and low-k, and ultra-low-k dielectric materials. Low-k dielectric materials have a nominal dielectric constant less than the dielectric constant of $SiO_2$, which is approximately 4 (e.g., the dielectric constant for thermally grown silicon dioxide can range from 3.9 to 4.0). In one embodiment, low-k dielectric materials may have a dielectric constant of less than 3.7. Suitable low-k dielectric materials include, for example, fluorinated silicon glass (FSG), carbon doped oxide, a polymer, a SiCOH-containing low-k material, a non-porous low-k material, a porous low-k material, a spin-on dielectric (SOD) low-k material, or any other suitable low-k dielectric material. Ultra-low-k dielectric materials have a nominal dielectric constant less than 2.5. Suitable ultra-low-k dielectric materials include, for example, SiOCH, porous pSiCOH, pSiCNO, carbon rich silicon carbon nitride (C-Rich SiCN), porous silicon carbon nitride (pSiCN), boron and phosporous doped SiCOH/pSiCOH and the like. In one illustrative embodiment, at least the IMD layer comprises a low-k or ultra-low-k dielectric material.

Interconnects 106 are formed in the ICD layer. The interconnect can include numerous interconnects. In one embodiment, the interconnect comprises a conductive line 106a in the upper portion or 1 MB while a contact 106b is formed in the lower portion or ILD. The interconnect comprises a conductive material. For example, the conductive material can be any metal or alloy. In one embodiment, the interconnect can comprise copper, aluminum, tungsten, their alloys, or a combination thereof. It is understood that the contacts and conductive line can comprise the same or different materials. The contact connects the conductive line to contact regions below. Depending on the ICD level, the contact region can be another metal line or a device, such as a diffusion region or a gate of a transistor or a plate of a capacitor.

A metal liner 108 is formed over dielectric layer 104 and interconnects 106. Metal liner 108 is a high resistance metal liner. Suitable material for metal liner 108 includes, for example, TaN, TiN, etc. Metal liner 108 can be deposited by conventional techniques such as, for example, chemical vapor deposition (CVD), plasma-enhanced CVD (PECVD), sputtering deposition, physical vapor deposition (PVD), atomic layer deposition (ALD), plating and other like processes. In one illustrative embodiment, metal liner 108 can have a thickness ranging from about 1 nanometers (nm) to about 10 nm.

A phase change layer 110 comprising a phase change material is formed on metal liner 108 by conventional techniques, e.g., CVD, a pulsed CVD, and ALD. In phase change memory, information is stored in materials that can be manipulated into different phases. Each of these phases exhibit different electrical properties which can be used for storing information. The amorphous and crystalline phases are typically two phases used for bit storage (1's and 0's) since they have detectable differences in electrical resistance. Specifically, the amorphous phase has a higher resistance than the crystalline phase.

In one embodiment, a suitable phase change material includes, for example, glass chalcogenides. This group of materials contain a chalcogen (Periodic Table Group 16/VIA) and a more electropositive element. For example, selenium (Se) and tellurium (Te) are the two most common semiconductors in the group used to produce a glass chalcogenide when creating a phase change layer. A representative example would be $Ge_2Sb_2Te_5$ (GST), $SbTe$, and $In_2Se_3$. However, some phase change materials do not utilize chalcogen, such as GeSb. Thus, a variety of materials can be used as a phase change material layer as long as they can retain separate amorphous and crystalline states.

A hardmask 112 is formed over phase change layer 110 by any conventional technique. For example, hardmask 112 can be deposited by, for example, CVD, PECVD, PVD, ALD, and other like processes. Hardmask 112 can then be subjected to a planarizing process such as a chemical mechanical planarization (CMP) process.

Hardmask 112 is then patterned to form a fin as shown in FIG. 2. The patterning of hardmask 112 is achieved by first applying a conventional photoresist (not shown) hardmask 112. After application of the photoresist to hardmask 112, the photoresist is subjected to a lithographic step that includes pattern wise exposure of the photoresist to a desired pattern of radiation and development of the exposed photoresist utilizing a conventional resist developer. The patterned photoresist protects a portion of hardmask 112, while leaving at least one other portion unprotected. The unprotected portions of hardmask 112 along with phase change layer 110 and metal liner 108 not including the patterned resist, are then removed by etching. Any etching process that removes the unprotected portions of hardmask 112 selective to the patterned resist can be used. Typically, a reactive ion etching (RIE) process or another like dry etching process is used. As shown, the etching process stops atop a portion of the upper surface of dielectric layer 104 and interconnects 106 such that the remaining portion of the metal liner 108 and phase change layer 110 under hardmask 112 forms a bridge 111 (see, FIG. 1) between the two interconnects 106. The photoresist used in forming the patterned hardmask 112 is typically stripped after the etching process.

Figure 3:
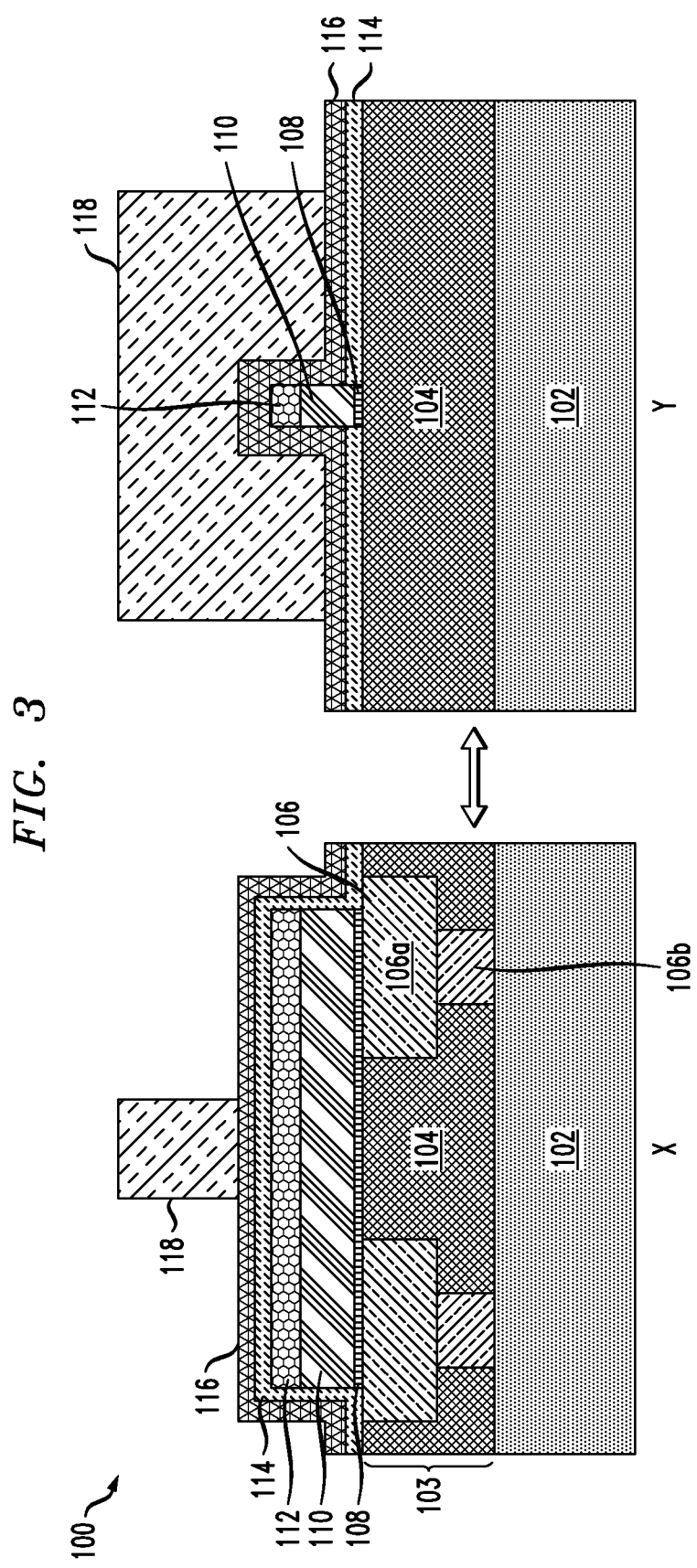
FIG. 3 is a cross sectional view of the structure of FIG. 1 at a second-intermediate fabrication stage, according to an illustrative embodiment.

FIG. 3 illustrates structure 100 at a second-intermediate stage. During this stage, gate dielectric layer 114 is formed on the exposed surfaces of dielectric layer 104, interconnects 106, metal liner 108, phase change layer 110 and hardmask 112. Gate dielectric layer 114 advantageously protects the sidewalls of phase change layer 110. Suitable gate dielectric material for gate dielectric layer 114 includes, for example, the same or different dielectric material as dielectric layer 104. Typically, dielectric layer 104 and dielectric layer 114 are comprised of an oxide of silicon. Gate dielectric layer 114 is typically formed utilizing a conventional deposition process, e.g., CVD. In one embodiment, gate dielectric layer 114 has a thickness ranging from about 1 nm to about 5 nm.

Metal gate liner 116 is then formed on gate dielectric layer 114 using a conventional deposition process, e.g., CVD, ALD, electroplating and other like processes. In one embodiment, the metal gate liner 116 and the gate dielectric layer 114 are configured to be orthogonal to the phase change layer 110. The metal gate liner 116 is configured as a resistive heater that includes, for example, a metal or metal alloy material that exhibits resistivity and a substantially high thermal conductivity. For example, the metal gate liner 116 can be formed from niobium (Nb), tungsten (W), platinum (Pt), nickel chromium (NiCr), titanium tungsten (TiW), TaN, TiN, or TaSiN, or any of a variety of similar metal or metal alloys. Thus, metal gate liner 116 can be configured to receive a current to switch the phase change layer 110 between the crystalline state and the amorphous state. In this case the phase change is obtained by passing a current in the metal gate liner 116 located over the phase change layer 110 and electrically insulated from the phase change layer 110 by gate dielectric layer 114. When current passes through the "resistive heater", the heater will warm up due to the Joule effect and thermal conduction produced by the "resistive heater" will indirectly change the state of the phase change layer 110. Metal gate liner 116 has a thickness ranging from about 4 nm to about 10 nm.

Next, hardmask 118 is formed over metal gate liner 116 by any conventional technique, e.g., CVD, PECVD, PVD, ALD, and other like processes. Suitable material for hardmask 118 can be SiN, TEOS or any other nonconductive films. Hardmask 118 can then be subjected to a planarizing process such as a CMP process. Hardmask 118 is then patterned and subjected to an etching process such as RIE to remove a portion of hardmask 118 to expose a portion of metal gate liner 116.

Figure 4:
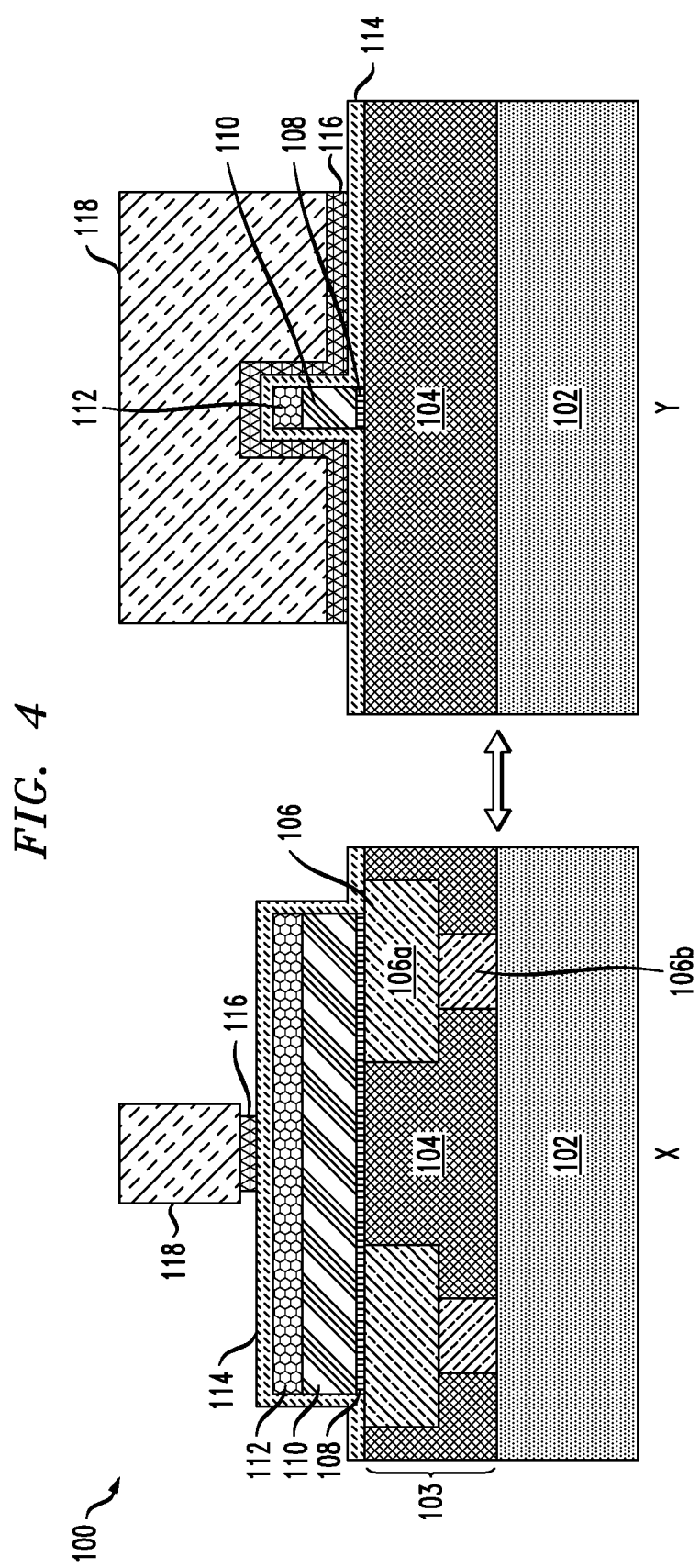
FIG. 4 is a cross sectional view of the structure of FIG. 1 at a third-intermediate fabrication stage, according to an illustrative embodiment.

FIG. 4 illustrates structure 100 at a third-intermediate stage. During this stage, the exposed portion of metal gate liner 116 is selectively removed leaving a portion of metal gate liner 116 on gate dielectric layer 114 under the bottom surface of hardmask 118. Removing metal gate liner 116 may include applying an etchant in an etch process, such as a RIE process, that is made selective to dielectric layer 114. For example, etching the exposed portion of metal gate liner 116 can be a dry etching performed using an etching gas. In illustrative embodiments, an etching gas used in the dry etching process may include a gas containing fluorine and $H_2O$ vapor, which may be e.g., CxFy, CHxFy, etc.

Figure 5:
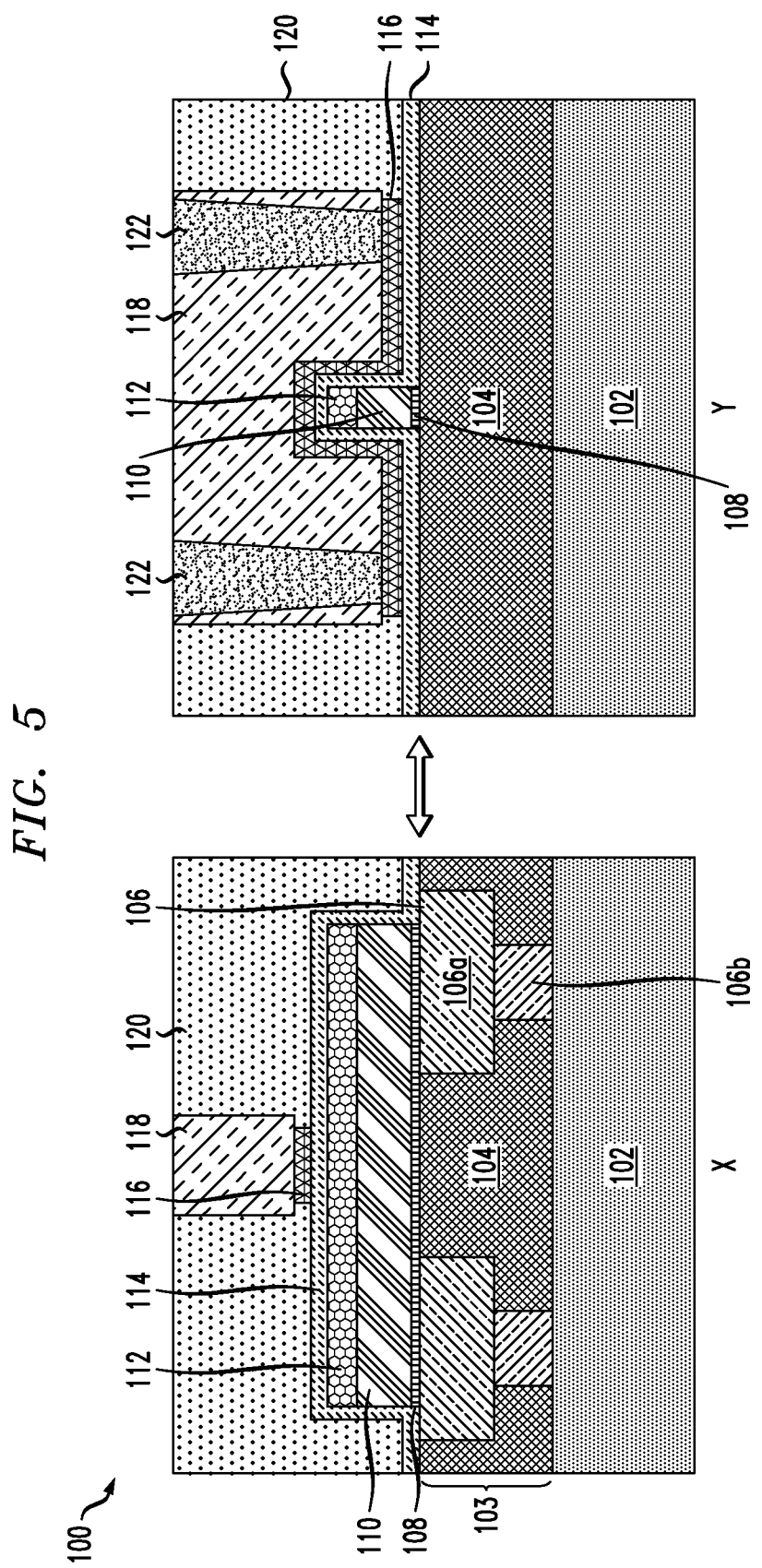
FIG. 5 is a cross sectional view of the structure of FIG. 1 at a fourth-intermediate fabrication stage, according to an illustrative embodiment.

FIG. 5 illustrates structure 100 at a fourth-intermediate stage. During this stage, dielectric fill 120 is formed on gate dielectric layer 114 and over hardmask layer 118. Dielectric fill 120 may be made of any known dielectric material such as, for example, silicon oxide, silicon nitride, hydrogenated silicon carbon oxide, low-k dielectrics, ultralow-k dielectrics, flowable oxides, porous dielectrics, or organic dielectrics including porous organic dielectrics. The low-k and ultra-low-k dielectric materials can be any of those discussed hereinabove with respect to the dielectric layer. The dielectric fill 120 may be formed by any suitable deposition technique known in the art, including ALD, CVD, PECVD, PVD, or other like processes. Dielectric fill 120 can then be subjected to a planarizing process such as a CMP process.

Next, metal contacts including metal gate contacts 122 are formed. For example, metal gate contacts 122 are an electrical connection to a gate. The metal gate contacts 122 are formed by first forming conductive vias or trenches by methods known in the art, e.g., by selectively etching through the hardmask 118 by, for example, RIE, such that the via or trench is communicative with the respective component, e.g., conductive vias or trenches for metal gate contacts 122 are communicative with the respective metal gate liner 116. A conductive material is then deposited within the via or trench. The conductive material for metal gate contacts 122 includes any suitable conductive material such as, for example, polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. The depositing step may be followed by or accompanied with an annealing step.

Figure 6:
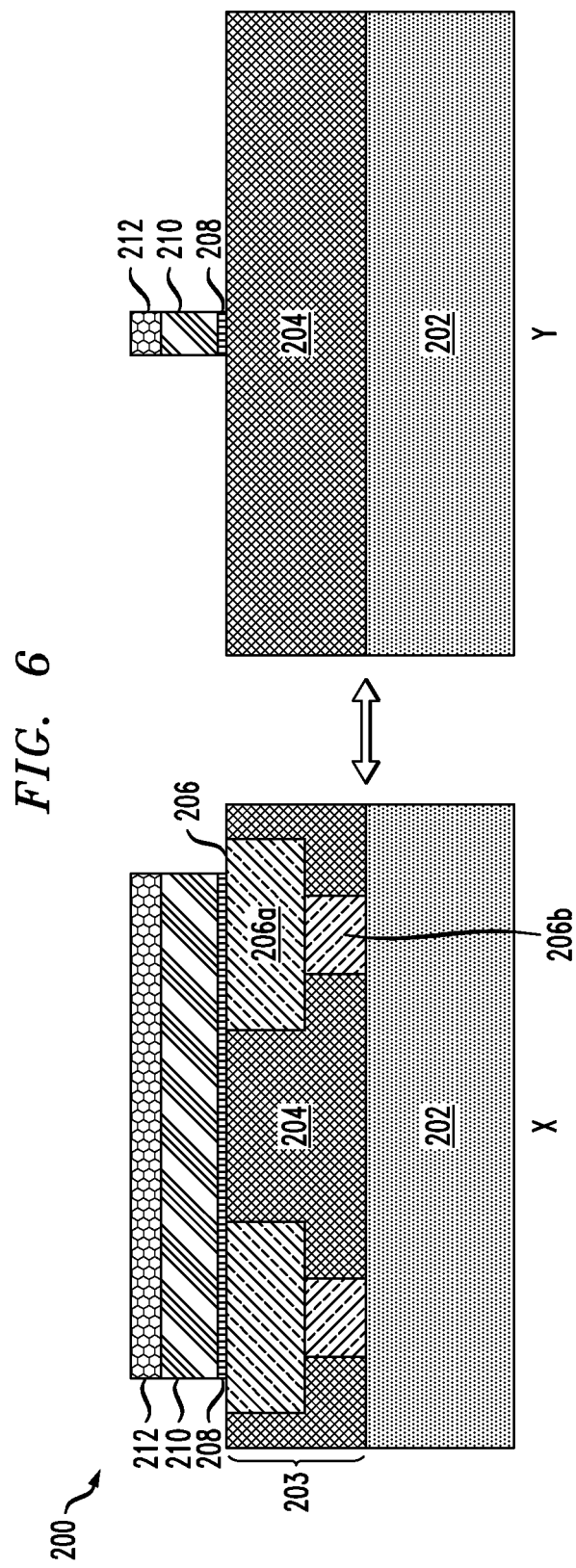
FIG. 6 is a cross sectional view of the structure of FIG. 1 at a first-intermediate fabrication stage, according to an alternative illustrative embodiment.

FIGS. 6-13 illustrate an alternate embodiment starting with the structure 200. FIG. 6 illustrates structure 200 at a first-intermediate fabrication stage. Structure 200 first includes substrate 202. In general, substrate 202 may comprise one or more different types of semiconductor substrate structures and materials as described above for substrate 102. Structure 200 further includes memory electrode 203 formed on substrate 202. Memory electrode 203 includes interconnects 206 in dielectric layer 204. As with dielectric layer 104 discussed above, dielectric layer 204 serves, for example, as an ICD layer in which interconnects are formed. In one embodiment, the ICD includes lower and upper portions. The lower portion serves as an ILD layer while the upper portion serves as an 1 MB layer. The dielectric layer can be a single layer or multi-layered stack. For example, a single layer can be used to serve as both the ILD and IMD or separate layers are used for the ILD and IMD. In some cases, an etch stop layer can be formed between the ILD and 1 MB.

The dielectric layer 204 can be deposited in a similar manner and of the same material as discussed above for dielectric layer 104. Interconnects 206 is formed in the ICD layer. The interconnect can include numerous interconnects. In one embodiment, the interconnect comprises a conductive line 206a in the upper portion or IMD while a contact 206b is formed in the lower portion or ILD. The interconnect 206 comprises a conductive material as discussed above for interconnect 106.

A metal liner 208 is formed over dielectric layer 204 and interconnects 206. Metal liner 208 is a high resistance metal liner. Metal liner 208 can be deposited in a similar manner and of the same material as discussed above for metal liner 108. In one illustrative embodiment, metal liner 208 can have a thickness ranging from about 1 nm to about 10 nm.

A sacrificial layer 210 is formed on metal liner 208 by conventional techniques, e.g., CVD and ALD. Suitable material for sacrificial layer 210 includes, for example, any amorphous material such as an amorphous silicon (a-Si) material or an amorphous silicon-germanium material (a-SiGe). In one embodiment, amorphous layer 210 can have a thickness ranging from about 10 nm to about 100 nm.

A hardmask 212 is formed over sacrificial layer 210 by any conventional technique as discussed above for hardmask 112. Hardmask 212 can then be subjected to a planarizing process such as a CMP process. Hardmask 212 is then patterned to form a fin as shown in FIG. 6. The patterning of hardmask 212 is achieved as discussed above. As shown, the etching process stops atop a portion of the upper surface of dielectric layer 204 and interconnects 206 such that the remaining portion of the metal liner 208 and sacrificial layer 210 under hardmask 212 forms a bridge such as bridge 111 (see, FIG. 1) between the two interconnects 206. The photoresist used in forming the patterned hardmask 212 is typically stripped after the etching process.

Figure 7:
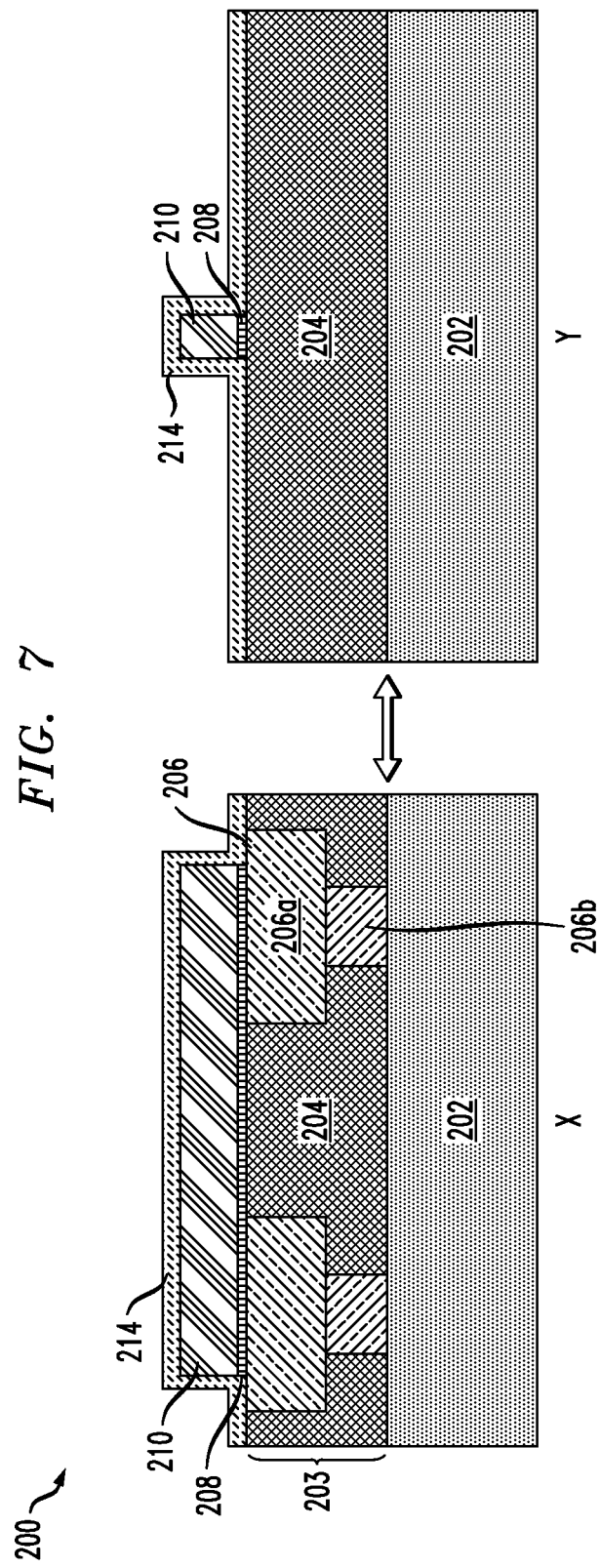
FIG. 7 is a cross sectional view of the structure of FIG. 1 at a second-intermediate fabrication stage, according to an alternative illustrative embodiment.

FIG. 7 illustrates structure 200 at a second-intermediate stage. During this stage, hardmask 212 is first removed by conventional techniques. Next, gate dielectric layer 214 is formed on the exposed surfaces of dielectric layer 204, interconnects 206, metal liner 208 and sacrificial layer 210. Gate dielectric layer 214 can be deposited in a similar manner and of the same material as discussed above for gate dielectric layer 114. In one embodiment, gate dielectric layer 214 is a relatively thin layer, e.g., a layer having a thickness ranging from about 1 nm to about 5 nm.

Figure 8:
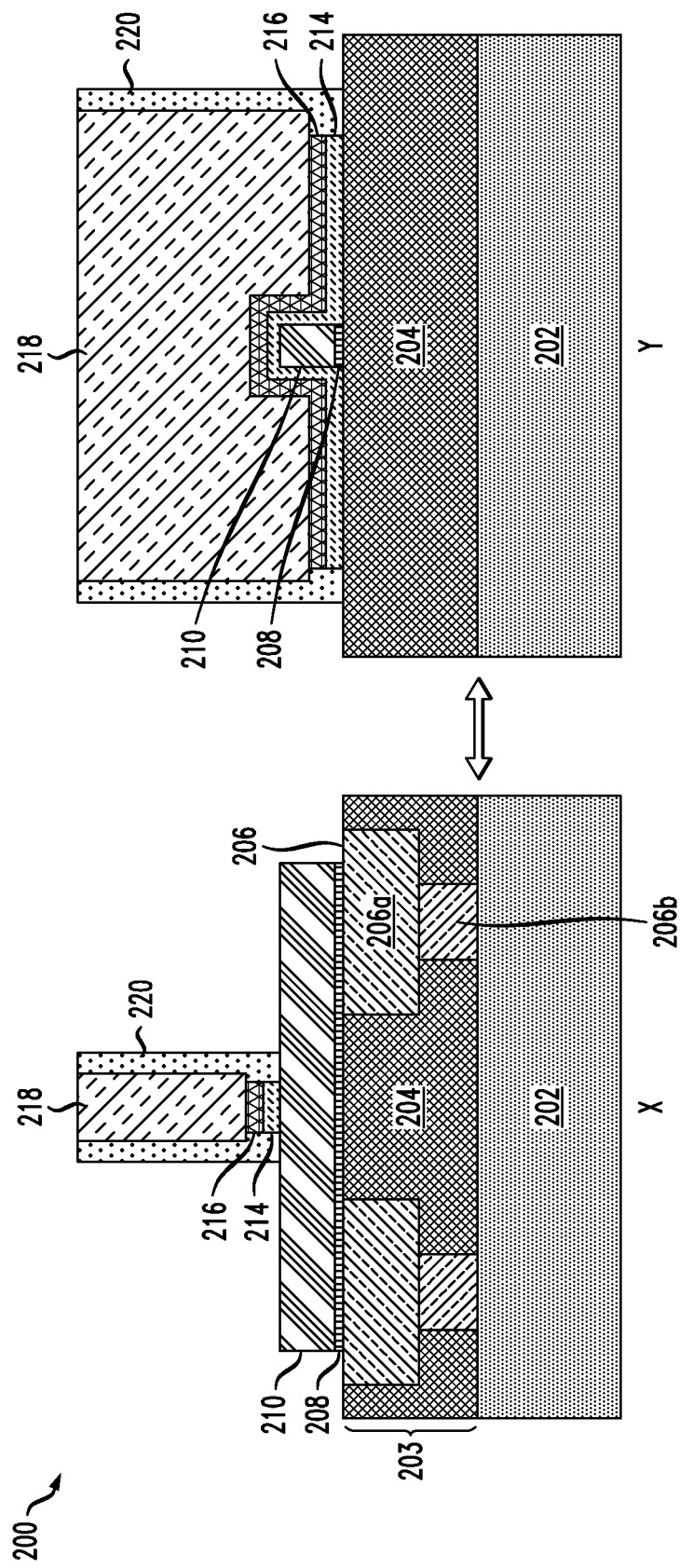
FIG. 8 is a cross sectional view of the structure of FIG. 1 at a third-intermediate fabrication stage, according to an alternative illustrative embodiment.

FIG. 8 illustrates structure 200 at a third-intermediate stage. During this stage, metal gate liner 216 is formed on gate dielectric layer 214. Metal gate liner 216 can be deposited in a similar manner and of the same material as discussed above for metal gate liner 116. As with metal gate liner 116, the metal gate liner 216 is configured as a resistive heater that includes, for example, a metal or metal alloy material that exhibits resistivity and a substantially high thermal conductivity. Thus, metal gate liner 216 can be configured to receive a current to switch the phase change layer 224, as discussed below, between the crystalline state and the amorphous state. In one embodiment, metal gate liner 216 is a relatively thin layer, e.g., a layer having a thickness ranging from about 4 nm to about 10 nm.

Next, hardmask 218 is formed over metal gate liner 216 by any conventional technique, e.g., CVD, PECVD, PVD, ALD, and other like processes. Hardmask 218 can be deposited in a similar manner and of the same material as discussed above for hardmask 118. Hardmask 218 can then be subjected to a planarizing process such as a CMP process. Hardmask 218 is then patterned and subjected to an etching process such as RIE to remove a portion of hardmask 218 to expose a portion of metal gate liner 216. The exposed portion of metal gate liner 216 is selectively removed along with gate dielectric layer 214 leaving a portion of metal gate liner 216 on gate dielectric layer 214 under the bottom surface of hardmask 218. Removing metal gate liner 116 may include applying an etchant in an isotropic etch process, such as a RIE process, that is made selective to dielectric layer 214. Dielectric layer 214 is then removed by applying an etchant in an isotropic etch process, such as a RIE process, that is made selective to dielectric layer 204, interconnects 206 and sacrificial layer 210.

Figure 9:
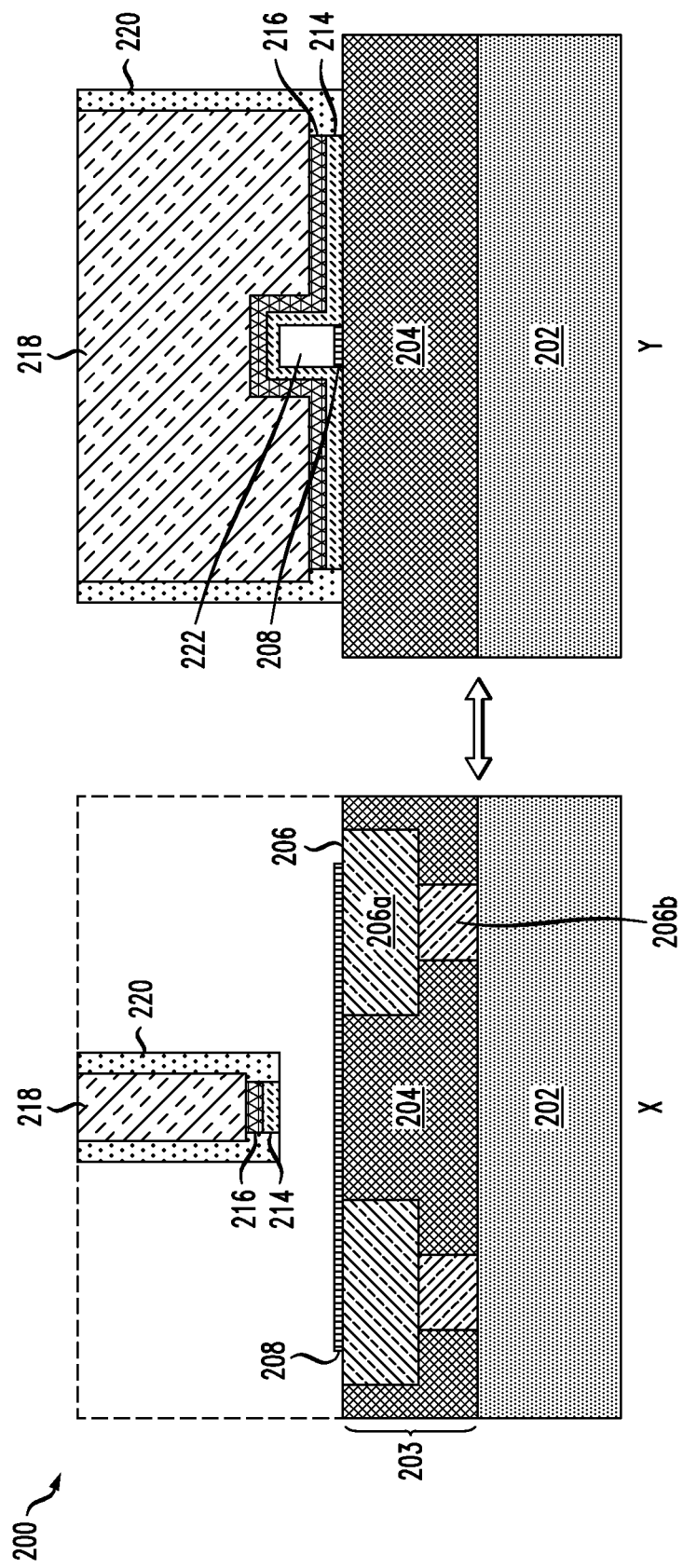
FIG. 9 is a cross sectional view of the structure of FIG. 1 at a fourth-intermediate fabrication stage, according to an alternative illustrative embodiment.

FIG. 9 illustrates structure 200 at a fourth-intermediate stage. It is to be appreciated that the dashed lines in the Y cross section location indicate support for connecting elements 214, 216 and 220 to structure 200, which is shown in structure 200 set forth in the X cross-section location. During this stage, gate spacers 220 are formed on at least sidewalls of gate dielectric layer 214, metal gate liner 216 and hardmask 218. Suitable material for gate spacers 220 includes, for example, $Si_3N_4$, SiBCN, SiNC, SiN, SiCO, $SiO_2$, and SiNOC. Gate spacers 220 can be formed by any conventional technique such as, for example, CVD, PECVD, PVD, ALD, and the like. Next, sacrificial layer 210 is selectively removed leaving air gap 222 defined between metal liner 208 and gate dielectric layer 214. Sacrificial layer 210 is selectively removed by, for example, hot ammonia or tetramethylammonium hydroxide (TMAH). if sacrificial material is a-Si.

Figure 10:
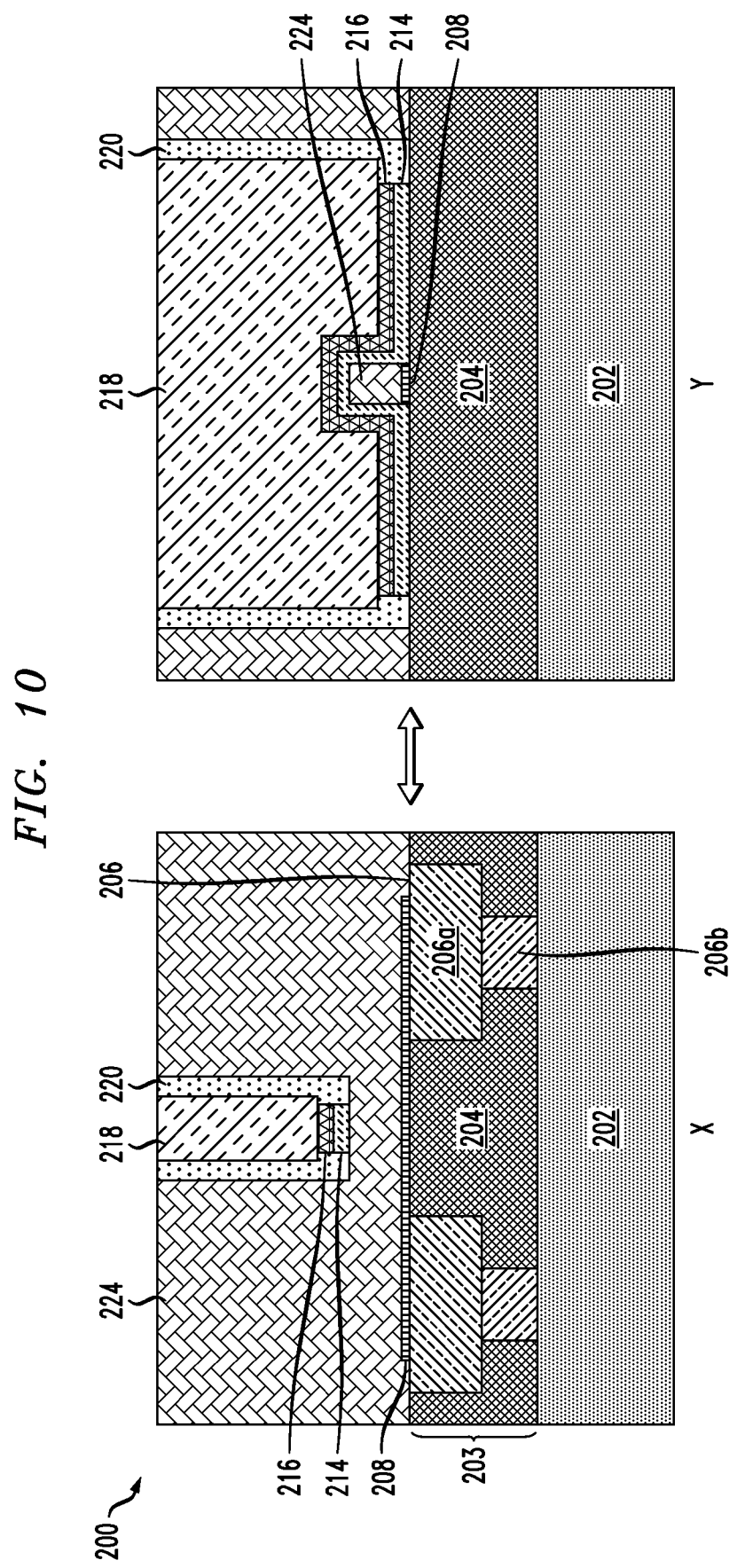
FIG. 10 is a cross sectional view of the structure of FIG. 1 at a fifth-intermediate fabrication stage, according to an alternative illustrative embodiment.

FIG. 10 illustrates structure 200 at a fifth-intermediate stage. During this stage, phase change layer 224 comprising a phase change material is formed on the exposed surfaces of dielectric layer 204, interconnects 206, and on the sidewalls of gate spacers 220 by conventional techniques, e.g., CVD. Phase change layer 224 is also formed in air gap 222 defined between metal liner 208 and gate dielectric layer 214. Phase change layer 224 can be of the same phase change material as discussed above for phase change layer

110. Phase change layer 224 can then be subjected to a planarizing process such as a CMP process.

Figure 11:
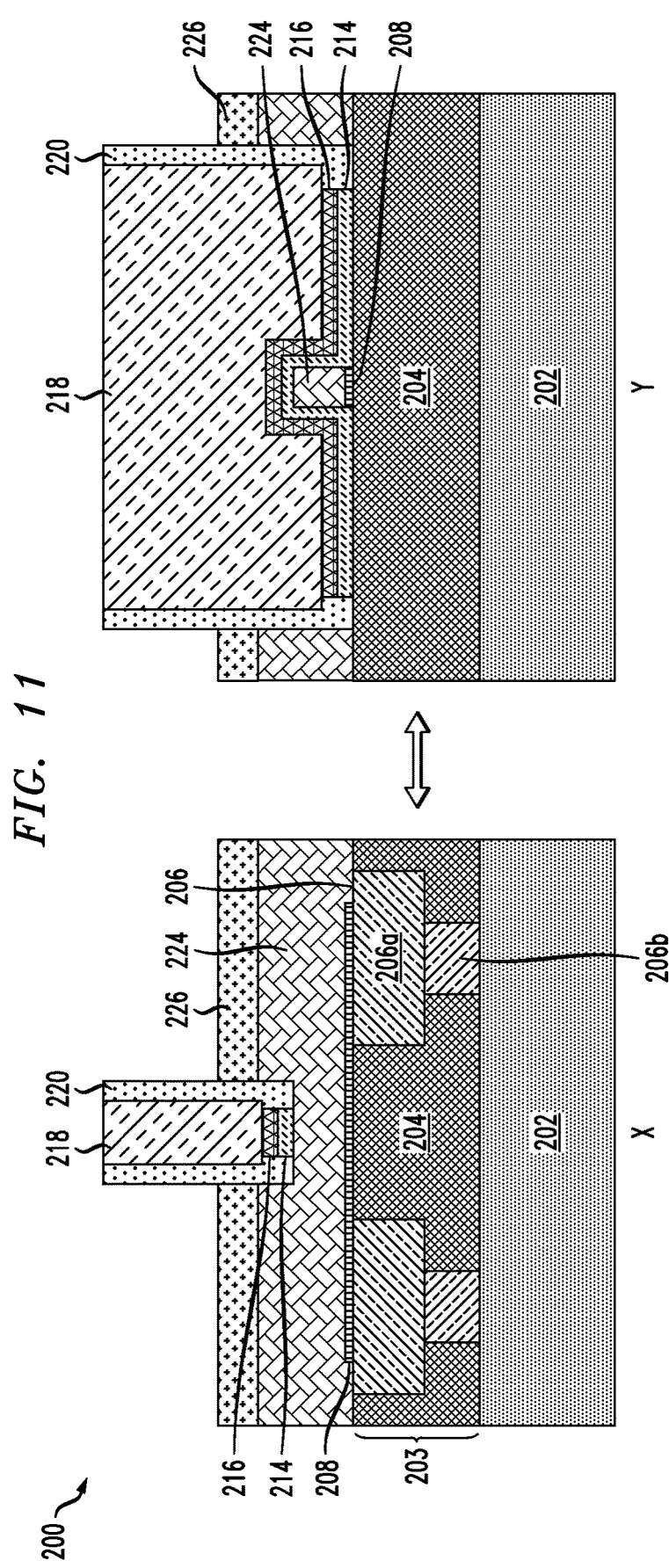
FIG. 11 is a cross sectional view of the structure of FIG. 1 at a sixth-intermediate fabrication stage, according to an alternative illustrative embodiment.

FIG. 11 illustrates structure 200 at a sixth-intermediate stage. During this stage, the phase change layer 224 is first recessed by, for example, RIE. Dielectric cap 226 is formed on the exposed surface of phase change layer 224 and sidewalls of gate spacers 220 by blanket or non-selective CVD. Suitable material for dielectric cap 226 includes, for example, silicon nitride (SiN), silicon carbide (SiC), silicon oxynitride (SiNO) or amorphous silicon carbonitride (SiC-yNx:H). In one embodiment, dielectric cap 226 has a thickness ranging from about 5 nm to about 50 nm.

Figure 12:
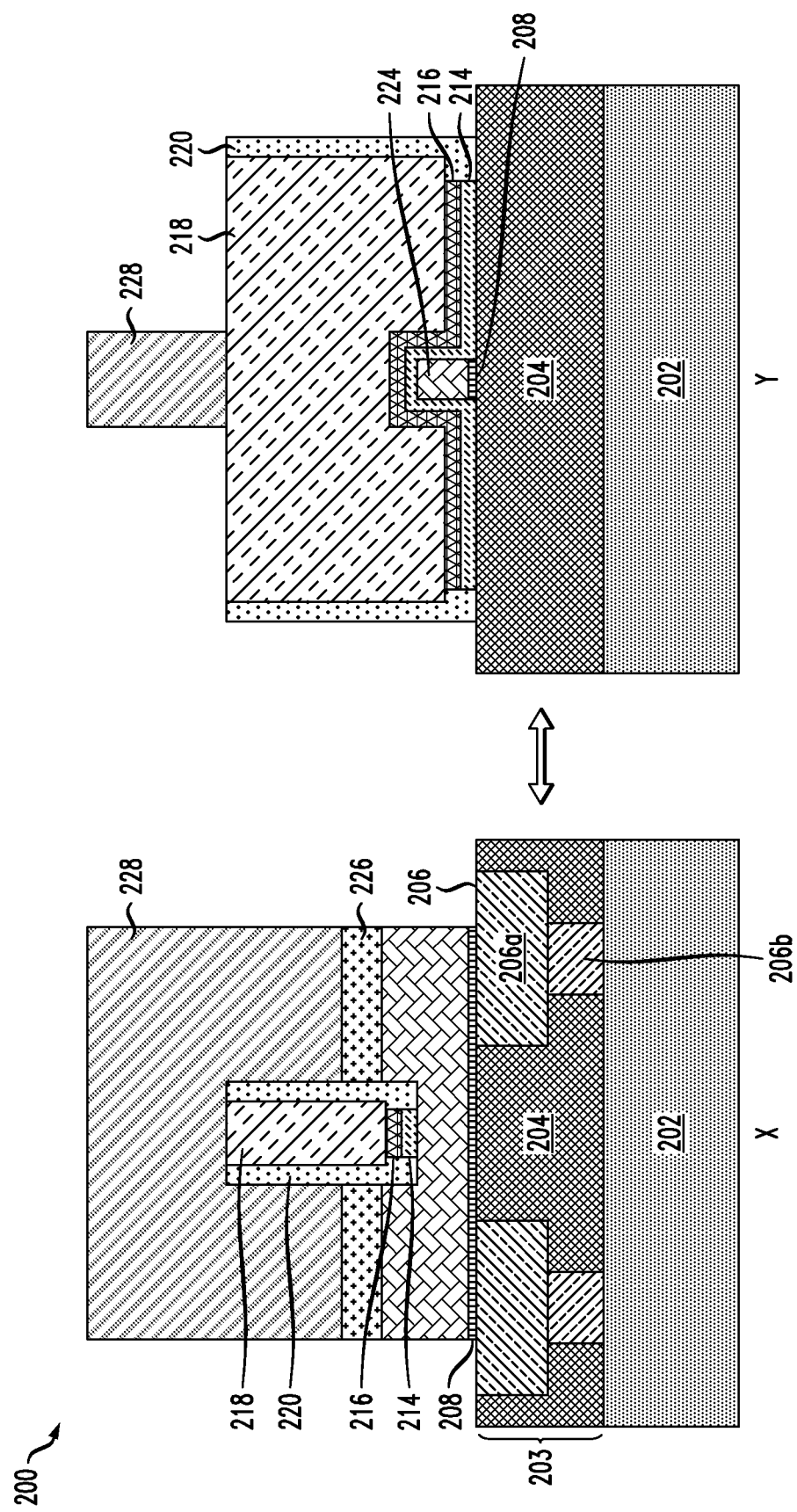
FIG. 12 is a cross sectional view of the structure of FIG. 1 at a seventh-intermediate fabrication stage, according to an alternative illustrative embodiment.

FIG. 12 illustrates structure 200 at a seventh-intermediate stage. During this stage, an organic planarization layer (OPL) 228 is deposited on dielectric cap 226 using, e.g., a spin-on coating process. The OPL 228 can be a self-planarizing organic material that includes carbon, hydrogen, oxygen, and optionally nitrogen, fluorine, and silicon. In one embodiment, the self-planarizing organic material can be a polymer with sufficiently low viscosity so that the top surface of the applied polymer forms a planar horizontal surface. In one embodiment, the OPL 228 can include a transparent organic polymer. In one embodiment, the OPL can be a standard CxHy polymer. Non-limiting examples of OPL materials include, but are not limited to, CHM701B, commercially available from Cheil Chemical Co., Ltd., HM8006 and HM8014, commercially available from JSR Corporation, and ODL-102 or ODL-401, commercially available from ShinEtsu Chemical, Co., Ltd.

OPL 228 is then patterned and subjected to standard lithography to remove a portion of OPL 228, dielectric cap 226, phase change layer 224 and metal liner 208 to expose a portion of dielectric layer 204 and interconnects 206 such that phase change layer 224 under OPL 228 and dielectric cap 226 forms a bridge between the two interconnects 206.

Figure 13:
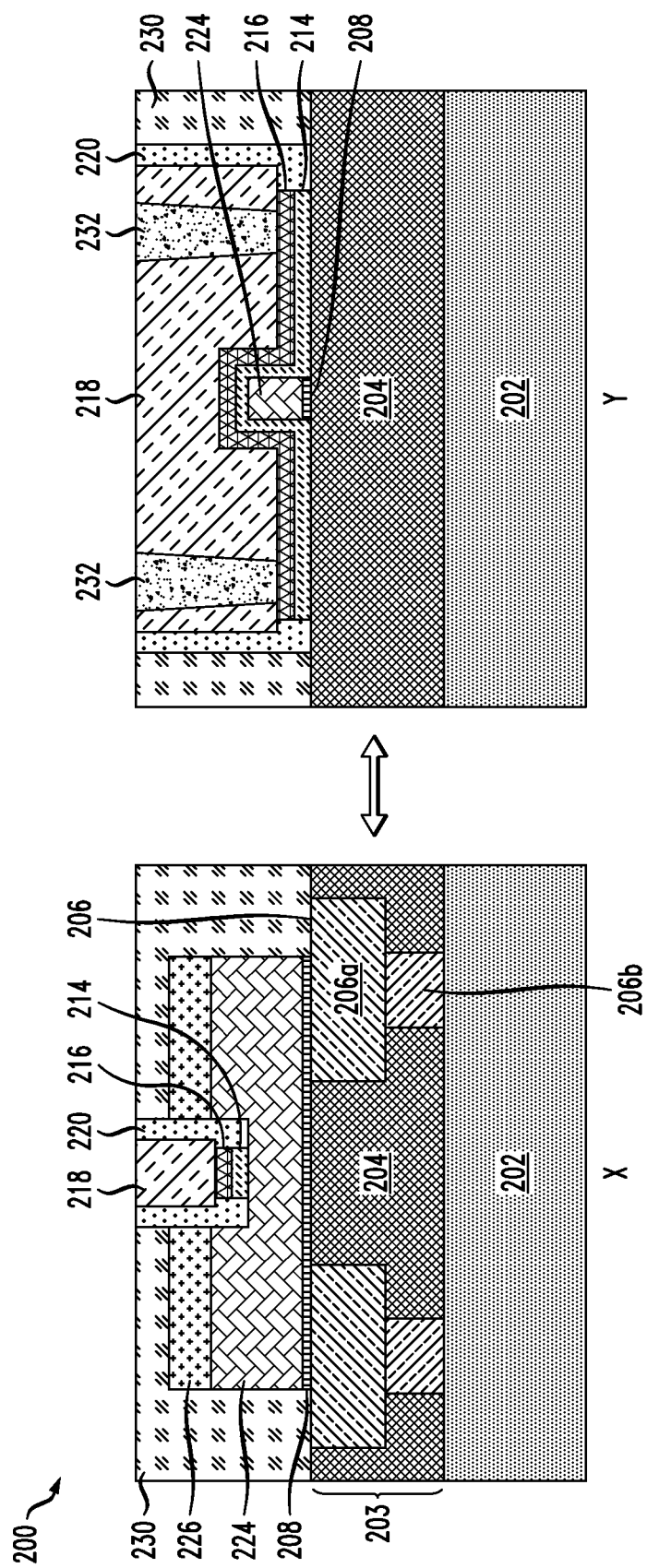
FIG. 13 is a cross sectional view of the structure of FIG. 1 at an eighth-intermediate fabrication stage, according to an alternative illustrative embodiment.

FIG. 13 illustrates structure 200 at an eighth-intermediate stage. During this stage, OPL 228 is removed (not shown) by a standard $O_2$ or $N_2/H_2$ based OPL ash. Dielectric fill 230 is formed on dielectric layer 204 and interconnects 206 and over dielectric cap 226. Dielectric fill can be deposited in a similar manner and of the same material as dielectric fill 120. Dielectric fill 220 can then be subjected to a planarizing process such as a CMP process. Next, metal contacts including metal gate contacts 232 are formed. For example, metal gate contacts 232 are an electrical connection to a gate. The metal contacts 232 are formed by first forming conductive vias or trenches by methods known in the art, e.g., selectively etching through the hardmask 218 by, for example, RIE, such that the via is communicative with the respective component, e.g., conductive vias or trenches for metal contacts 232 communicative with the respective metal gate liner 216. A conductive material is then deposited within the via. The conductive material for metal gate contacts 232 can be any of those discussed above for metal gate contacts 122 The depositing step may be followed by or accompanied with an annealing step.

It is to be understood that the methods discussed herein for fabricating low-resistivity metallic interconnect structures (e.g., copper BEOL interconnect structures) can be incorporated within semiconductor processing flows for fabricating other types of semiconductor structures and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

What is claimed is:

1. A phase change material switch comprising:
   a metal liner disposed on a portion of a dielectric layer;
   a phase change layer disposed on the metal liner;
   a gate dielectric layer disposed on the dielectric layer and the phase change layer; and
   a metal gate liner disposed on the gate dielectric layer.

2. The phase change material switch of claim 1, wherein the phase change layer comprises a phase change material.

3. The phase change material switch of claim 2, wherein the phase change material comprises one of selenium and tellurium.

4. The phase change material switch of claim 2, wherein the phase change material is $Ge_2Sb_2Te_5$ (GST).

5. The phase change material switch of claim 1, further comprising:
   a hardmask disposed on the metal gate liner;
   one or more trenches disposed in the hardmask; and
   a conductive material disposed in the one or more trenches and on the metal gate liner.

6. The phase change material switch of claim 5, further comprising a sidewall spacer disposed on the hardmask, the metal gate liner and the gate dielectric layer.

7. The phase change material switch of claim 1, wherein the metal gate liner and the gate dielectric layer are configured to be orthogonal to the phase change layer.

8. The phase change material switch of claim 7, in the form of a four-terminal phase change material switch.

9. A phase change material bridge device comprising:
   an electrode comprising an intra-metal dielectric layer and at least two metal contact vias in the intra-metal dielectric layer;
   a metal liner disposed on a portion of the intra-metal dielectric layer and the at least two metal contact vias;
   a phase change layer disposed on the metal liner;
   a gate dielectric layer disposed on the metal liner and the phase change layer and a remaining portion of the intra-metal dielectric layer and the at least two metal contact vias, wherein the metal liner and the phase change layer comprise a horizontal bridge between the at least two metal contact vias; and
   a metal gate liner disposed on the gate dielectric layer.

10. The phase change material bridge device of claim 9, wherein the phase change layer comprises a phase change material.

11. The phase change material bridge device of claim 10, wherein the phase change material comprises one of selenium and tellurium.

12. The phase change material bridge device of claim 10, wherein the phase change material is $Ge_2Sb_2Te_5$ (GST).

13. The phase change material bridge device of claim 9, further comprising:
a hardmask disposed on the metal gate liner;
one or more trenches disposed in the hardmask; and
a conductive material disposed in the one or more trenches and on the metal gate liner.

14. The phase change material bridge device of claim 9, wherein the metal gate liner and the gate dielectric layer are configured to be orthogonal to the phase change layer.

15. A semiconductor structure comprising:
a semiconductor substrate;
an electrode disposed on the semiconductor substrate, wherein the electrode comprises an intra-metal dielectric layer and at least two metal contact vias in the intra-metal dielectric layer;
a metal liner disposed on a portion of the intra-metal dielectric layer and the at least two metal contact vias;
a phase change layer disposed on the metal liner; wherein the metal liner and the phase change layer comprise a horizontal bridge between the at least two metal contact vias;
a gate dielectric layer disposed on the phase change layer; and
a metal gate liner disposed on the gate dielectric layer.

16. The semiconductor structure of claim 15, wherein the phase change layer comprises one of selenium and tellurium.

17. The semiconductor structure of claim 15, wherein the phase change layer comprises $Ge_2Sb_2Te_5$ (GST).

18. The semiconductor structure of claim 15, wherein the metal gate liner and the gate dielectric layer are configured to be orthogonal to the phase change layer.

19. An integrated circuit comprising:
one or more semiconductor structures, wherein at least one of the one or more semiconductor structures comprises:
a semiconductor substrate;
an electrode disposed on the semiconductor substrate, wherein the electrode comprises an intra-metal dielectric layer and at least two metal contact vias in the intra-metal dielectric layer;
a metal liner disposed on a portion of the intra-metal dielectric layer and the at least two metal contact vias;
a phase change layer disposed on the metal liner; wherein the metal liner and the phase change layer comprise a horizontal bridge between the at least two metal contact vias;
a gate dielectric layer disposed on the phase change layer; and
a metal gate liner disposed on the gate dielectric layer.

20. The integrated circuit of claim 19, wherein the at least one of the one or more semiconductor structures further comprises:
a hardmask disposed on the metal gate liner;
one or more trenches disposed in the hardmask; and
a conductive material disposed in the one or more trenches and on the metal gate liner.

21. The integrated circuit of claim 19, wherein the metal gate liner and the gate dielectric layer are configured to be orthogonal to the phase change layer.

22. The integrated circuit of claim 19, wherein the phase change layer comprises one of selenium and tellurium.

23. A 4-terminal switching device comprising:
a gate dielectric layer disposed on a dielectric layer and between a phase change layer and a metal gate liner; wherein the metal gate liner and the gate dielectric layer are configured to be orthogonal to the phase change layer.

24. The 4-terminal switching device of claim 23, further comprising the phase change layer disposed on a metal liner.

25. The 4-terminal switching device of claim 23, wherein the phase change layer comprises one of selenium and tellurium.

* * * * *